United States Patent [19]

Kondou

[11] Patent Number: 5,073,893
[45] Date of Patent: Dec. 17, 1991

[54] SEMICONDUCTOR STRUCTURE AND SEMICONDUCTOR LASER DEVICE

[75] Inventor: Masahiko Kondou, Kokubunji, Japan
[73] Assignee: Hitachi, Ltd., Tokyo, Japan
[21] Appl. No.: 545,288
[22] Filed: Jun. 27, 1990

[30] Foreign Application Priority Data

Jun. 29, 1989 [JP] Japan .................................. 1-165464

[51] Int. Cl.$^5$ .................................................. H01S 3/19
[52] U.S. Cl. ............................................ 372/45; 357/4; 357/17
[58] Field of Search ................... 372/43, 45; 357/4, 17

[56] References Cited

U.S. PATENT DOCUMENTS

| 4,785,457 | 11/1988 | Asbeck et al. | 372/45 |
| 4,805,179 | 2/1989 | Harder et al. | 372/45 |

FOREIGN PATENT DOCUMENTS

| 0092683 | 5/1985 | Japan | 372/45 |
| 0092685 | 5/1985 | Japan | 372/45 |
| 0045090 | 2/1987 | Japan | 372/45 |
| 0051283 | 3/1987 | Japan | 372/45 |
| 62-236387 | 3/1988 | Japan . | |

OTHER PUBLICATIONS

Bell Communications Research, Navesink Research and Engineering Center, 331 Newman Springs Road, Red Bank, N.J. 07701, Patterned Quantum Well Semiconductor Injection Lasers, E. Kapon, C. P. Yun, D. M. Hwang, J. P. Harbison, R. Bhat and N. G. Stoffel, 7/18/88.

Primary Examiner—Georgia Epps
Attorney, Agent, or Firm—Kenyon & Kenyon

[57] ABSTRACT

A semiconductor structure has a substrate crystal having a plurality of crystal orientations. Above the substrate is an atomic-layer superlattice in which different semiconductors are laminated one over another with a period in terms of atomic layers. This structure makes it possible to realize a semiconductor structure in which several kinds of quantum wires or quantum boxes having different physical properties, or an atomic-layer superlattice having an enlarged structure of the quantum wire or quantum box, are arranged in the plane orientation of the same substrate. In addition, the structure makes it possible to realize a semiconductor laser device having this structure.

7 Claims, 5 Drawing Sheets

SEMICONDUCTOR STRUCTURE AND SEMICONDUCTOR LASER DEVICE

BACKGROUND OF THE INVENTION

The present invention relates to a semiconductor structure for semiconductor devices and also to a semiconductor laser device made with the semiconductor structure.

Japanese Patent Laid-open No. 236387/1988 discloses a conventional semiconductor device having an atomic-layer superlattice structure in which layers are arranged accurately in the atomic scale in the direction of crystal growth.

The known literature teaches that a conventional process for forming quantum wires and quantum boxes by a single process of crystal growth consists of first forming minute projections and depressions on the substrate crystal and subsequently forming, by crystal growth, quantum wires and quantum boxes on the tops of the projections and at the bottoms of the depressions, respectively. (See Proceedings in the 10th IEEE International Semiconductor Laser Conference, Kanazawa, Japan (1986) pp. 8–9; and Proceedings in the 16th International Conference on Quantum Electronics, Tokyo, Japan (1988) pp. 30–31.)

SUMMARY OF THE INVENTION

The conventional technology described in the 1986 publication mentioned above does not give particular attention to the formation of the structure in the in-plane direction. In other words, it presents a problem associated with the accuracy of the structure in the in-plane direction, because for the formation of a desired structure in the in-plane direction, it involves the steps of forming an atomic-layer superlattice structure, performing etching for the fabrication in the in-plane direction, and growing crystal, again to bury the formed structure. Therefore, the accuracy in the in-plane direction depends on the accuracy of the etching, and it is about 100 nm (equivalent to a 1000-atom layer) at the best. This is much poorer than the accuracy in the direction of crystal growth.

The conventional technology described in the 1988 publication mentioned above, which is designed so as to form the above-mentioned structure on the tops of the projections and at the bottoms of the depressions, has a disadvantage in that it is difficult to form a plurality of the above-mentioned structures at intervals narrow enough for the quantum interaction in the in-plane direction. It has an additional disadvantage that it does not permit the repeated formation of the same structure in the direction of crystal growth.

The present invention provides a semiconductor structure in which several kinds of atomic-layer superlattice structures differing in characteristic properties from one another are arranged accurately in the in-plane direction. The present invention further provides a semiconductor laser made with said semiconductor structure.

In an embodiment of the present invention a semiconductor structure has a substrate crystal having a plurality of crystal orientations. Above the crystal there is an atomic-layer superlattice in which different semiconductors are laminated one over another with a period in terms of atomic layers.

In this semiconductor structure the atomic-layer superlattice may include semiconductor layers each having a thickness of 1-atom layer to 5-atom layer.

The semiconductor structure may have a crystal orientation that includes at least one plane selected from the group consisting of the (100) plane and the (111) plane.

In another embodiment semiconductor structure has a substrate crystal having a plurality of crystal orientations and above the crystal there is an atomic-layer superlattice in which different semiconductors are laminated one over another with a period in terms of atomic layers. At least a part of said atomic-layer superlattice has different physical constants than the remainder.

In another embodiment semiconductor laser device has a substrate. Two cladding layers and one active layer interposed between said cladding layers are disposed on the substrate. The substrate may be a substrate crystal having two (100) planes and at least one (111) plane arranged between said two (100) planes. At least one layer selected from the group of said two cladding layers and one active layer is an atomic-layer superlattice in which different semiconductors are laminated one over another with a period in terms of 1-atom layer to 5-atom layer, and a light emitting active region in said active layer being above said (111) plane.

In the semiconductor laser device at least one layer of said cladding layers may be the atomic-layer superlattice and the portion thereof corresponding to said active region has a refractive index larger than that of remainder. The active region may include one (111) plane, with said cladding layers and active layer as the atomic-layer superlattice. The portions thereof corresponding to said active region each has a refractive index larger than that of remainder.

The semiconductor laser device may have a substrate crystal corresponding to said active region that has a plurality of (111) planes and a plurality of (100) planes arranged between said (111) planes. The active layer is said atomic-layer superlattice and said active region consists of quantum wire structure.

The cladding layers of the semiconductor laser device can also be said atomic-layer superlattice.

In the reference to a part of said atomic-layer superlattice being arranged substantially above the specific crystal orientation of substrate crystal does not mean the part right above the specific crystal orientation. However, it includes one which is arranged obliquely above the specific crystal orientation, as explained later in the section of examples.

The phrase "period in terms of atomic layers" means a thickness equivalent to a 1-atom layer to a 10-atom layer, preferably a 1-atom layer to a 5-atom layer.

Figure 2A:
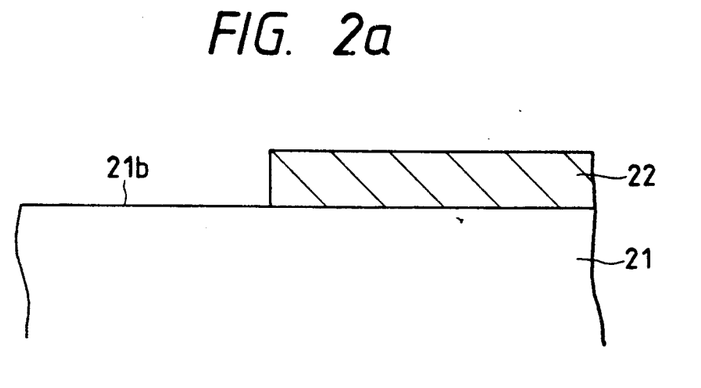
FIGS. 2a and 2b are sectional views illustrating one method of forming a substrate crystal having a plurality of plane orientations.
Figure 2B:
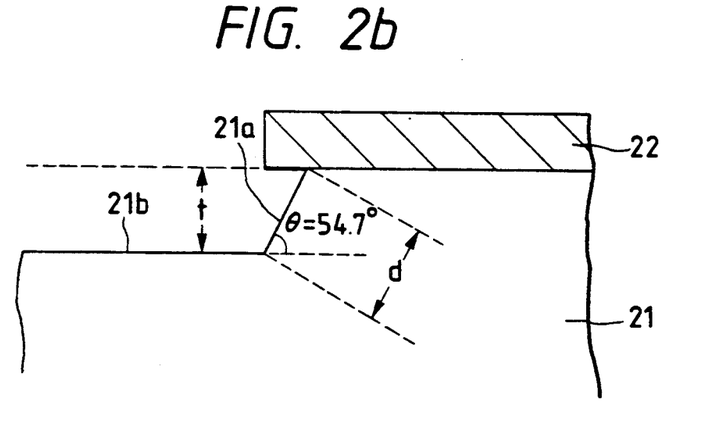

The substrate crystal having a plurality of crystal orientations can be prepared by a process illustrated in FIGS. 2a and 2b. First, the substrate crystal (21) having the (100) plane (21b) undergoes lithographic process so that the desired part (right part in FIG. 2a) is covered with the resist (22). Then, the substrate crystal undergoes wet etching with a phosphoric etchant so that side etching takes place at the edge of the resist (22) as shown in FIG. 2b and etching stops at the (111) plane (21a). Since the depth (t) of etching depends on the width (d) of the facet of the (111) plane (21a), good reproducibility is achieved in the production of the substrate crystal having a plurality of crystal orientations.

Figure 1A:
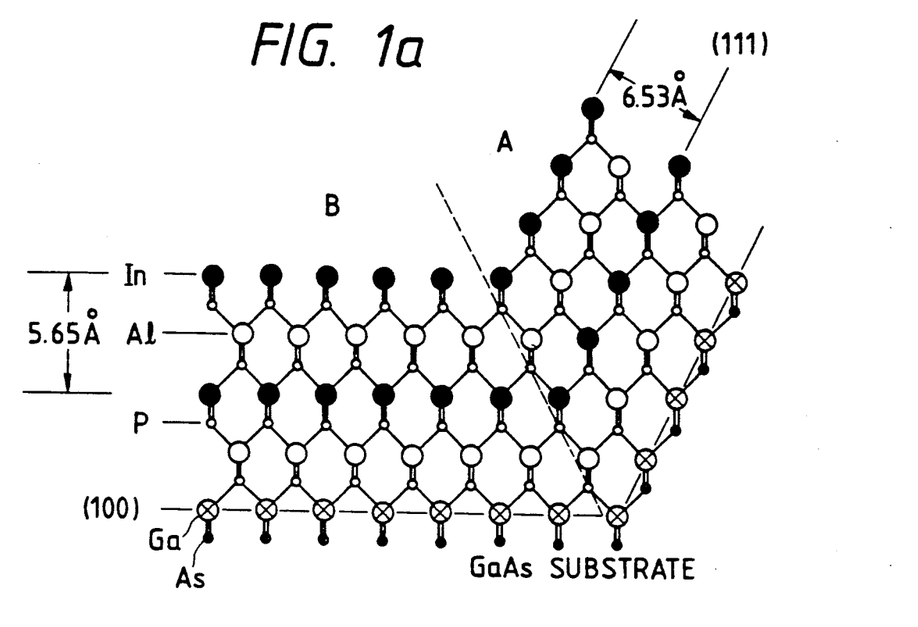
FIG. 1a is a schematic representation showing the arrangement of atoms in the $(AlP)_1(InP)_1$ atomic-layer superlattice formed on a GaAs substrate having the (100) plane and (111) plane.

The atomic-layer superlattice semiconductor varies in physical constants depending on how many semiconductor layers it is made up of, or on the period of the superlattice, even though the average composition remains the same, as disclosed in Japanese Patent Laid-open No. 236387/1988. This will be apparent if we carefully examine an instance in which an atomic-layer superlattice composed of 1-atom layers of AlP and InP arranged alternately on top of the other is epitaxially grown on a GaAs substrate crystal, as shown in FIG. 1a. (In the following, the atomic-layer superlattice formed in this manner is represented by $(AlP)_1(InP)_1$ in which each subscript denotes the number of layers.) Part A of the atomic-layer superlattice on the (111) plane and part B of the atomic-layer superlattice on the (100) plane have it in common that 1-atom layers of AlP and InP are arranged alternately on top of the other. Nevertheless, the two superlattices have different periods, 6.53 Å and 5.65 Å, respectively, because the atoms of Al, P, In, and P are arranged in different directions with respect to the surface of the substrate.

Because of this difference in period the band gap of part A on the (111) plane is lower than that of part B on the (100) plane. The difference in band gap varies depending on the period of the atomic-layer superlattice and the material from which the atomic-layer superlattice is made. Usually, it ranges from tens of meV to 100 meV. Moreover, part A on the (111) plane has a greater refractive index than part B on the (100) plane because the band gap is related to the polarization state. It will be understood from the foregoing that the two atomic-layer superlattices exhibit entirely different physical properties according to the plane orientation of the substrate crystal, even though they have the same alternation and the same constituent atoms.

Figure 1B:
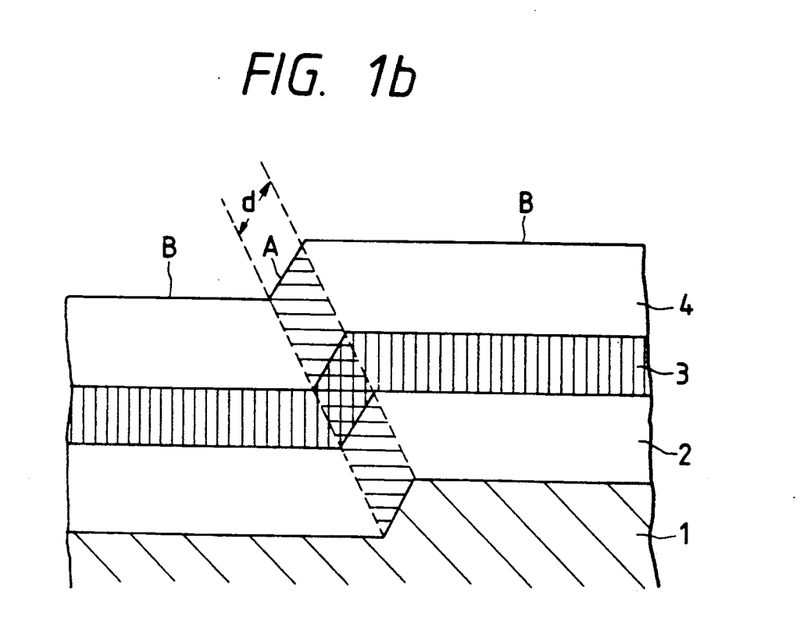
FIG. 1b is a schematic representation illustrating the double-hetero structure of $(AlP)_1(InP)_1$ and $(GaP)_1(InP)_1$ formed on the (100) GaAs substrate having the (111) facet.

In the case where three semiconductor layers of double-hetero structure are formed on the (111) plane and (100) plane, one being of $(GaP)_1(InP)_1$ indicated by (3) and two being of $(AlP)_1(InP)_1$ indicated by (2 and 4), as shown in FIG. 1b, the $(GaP)_1(InP)_1$ has a lower band gap and a higher refractive index than the $(AlP)_1(InP)_1$. Since the band gap is lower and the refractive index is higher in part A on the (111) plane than in part B on the (100) plane, as mentioned above, the lowest band gap and the highest refractive index exist in part A of the $(GaP)_1(InP)_1$ on the (111) plane. If the (111) plane on the GaAs substrate has a width (d) smaller than tens of nm, part A of the $(GaP)_1(InP)_1$ will function as a quantum wire.

In this case, lateral confinement in $(GaP)_1(InP)_1$ layer a 3 is consequence of the present invention, while vertical confinement between $(GaP)_1(InP)_1$ 3 and $(AlP)_1(InP)_1$ 2, 4 is not a consequence of the present invention, but of the material difference thereof. Therefore, it is not essential that the confinement layers 2, 4 be made of atomic-layer superlattice.

DETAILED DESCRIPTION

EXAMPLE 1

Figure 3:
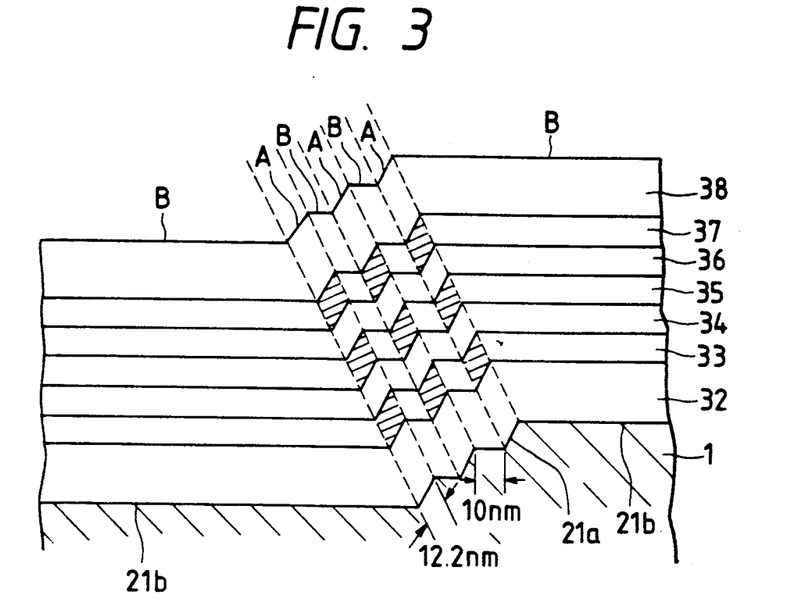
FIG. 3 is a sectional view of one embodiment of the semiconductor structure pertaining to the present invention.

An embodiment of the semiconductor structure pertaining to the present invention will be explained with reference to FIG. 3. The first step was to prepare a (100) plane GaAs substrate (1) having three (111) plane facet lines, each 12.2 nm wide, at an interval of 10 nm, as shown in FIG. 3. The second step was the organometallic vapor phase epitaxy (OMVPE) for crystal growth using trimethyl aluminum (TMA), trimethyl gallium (TMG), trimethyl indium (TMI), phosphine, and arsine.

The GaAs substrate (1) was placed in a horizontal reactor for OMVPE under atmospheric pressure. The reactor was heated to 450° C. for crystal growth in the arsine atmosphere. Into the reactor were admitted TMA, phosphine, TMI, and phosphine sequentially 36 times, so as to form a 20-nm thick $(AlP)_1(InP)_1$ (32). Again, into the reactor were admitted TMG, phosphine, TMI, and phosphine sequentially 18 times, so as to form a 10-nm thick $(GaP)_1(InP)_1$ (33). This procedure was repeated so as to form a 10-nm thick $(AlP)_1(InP)_1$ (34), a 10-nm thick $(GaP)_1(InP)_1$ (35), a 10-nm thick $(AlP)_1(InP)_1$ (36), a 10-nm thick $(GaP)_1(InP)_1$ (37), and a 20-nm thick $(AlP)_1(InP)_1$ (38). Thus there were formed nine quantum wires indicated by hatching in FIG. 3.

EXAMPLE 2

Figure 4A:
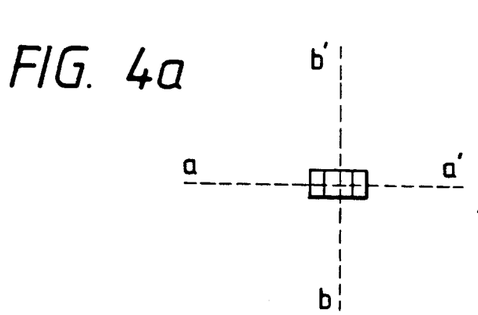
FIGS. 4a, 4b, and 4c are a top view, sectional view (along a-a'), and sectional view (along b-b'), respectively, of one example of substrate crystal to be used in the present invention.
Figure 4B:
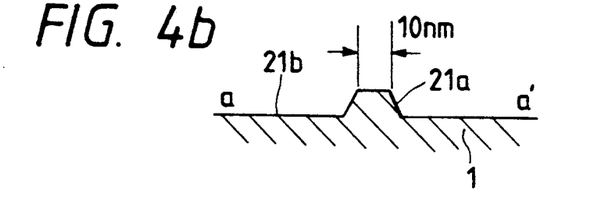
Figure 4C:
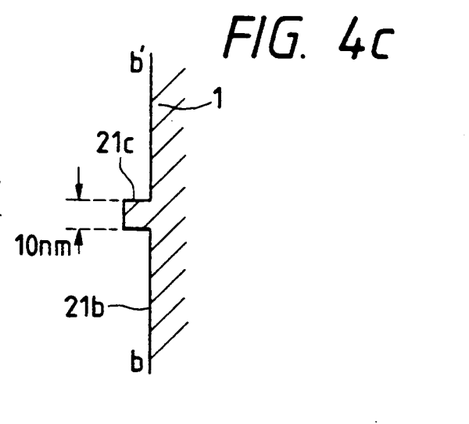
Figure 5A:
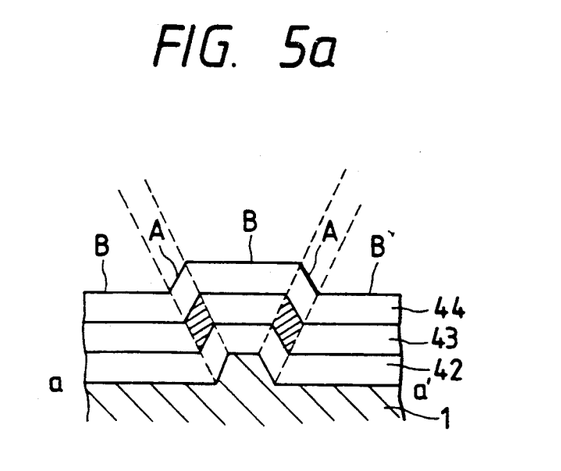
FIGS. 5a and 5b are sectional views of a semiconductor structure, each corresponding to section a-a' and section b-b' in FIG. 4b and FIG. 4c, respectively.
Figure 5B:
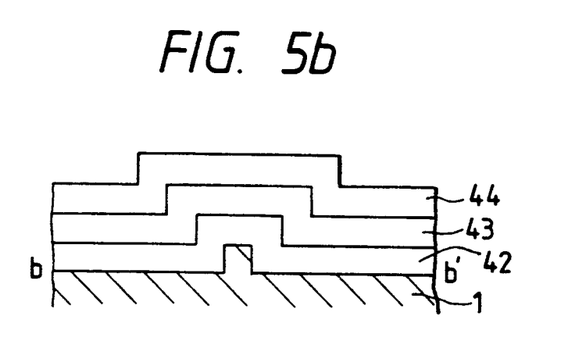

The first step was to prepare a GaAs substrate (1) having a projection as shown in FIG. 4a (top view), FIG. 4b (sectional view along a-a'), and FIG. 4c (sectional view along b-b'). On this substrate were formed by epitaxy a 36-atom layer of AlAs, 10 nm thick (42), an atomic-layer superlattice of $(AlAs)_2(GaAs)_2$ with 9 periods, 10 nm thick (43), and a 36-atom layer of AlAs, 10 nm thick (44), as shown in FIGS. 5a and 5b. (Incidentally, FIG. 5a and FIG. 5b correspond to FIG. 4a and FIG. 4b, respectively.) The crystal growth was achieved by molecular beam epitaxy (MBE) with aluminum, gallium, and metallic arsenic, at 500° C. and $10^{-10}$ Torr. The epitaxial layers were formed by opening and closing the shutter of an arsenic K-cell and the shutter of an aluminum K-cell alternately, while observing the RHEED intensity.

Part A of the $(AlAs)_2(GaAs)_2$ (43) above the (111) plane (indicated by hatching), which lies between parts B above the (100) plane, has the lowest band gap and highest refractive index. Therefore, this part functions as a quantum box.

EXAMPLE 3

Figure 6:
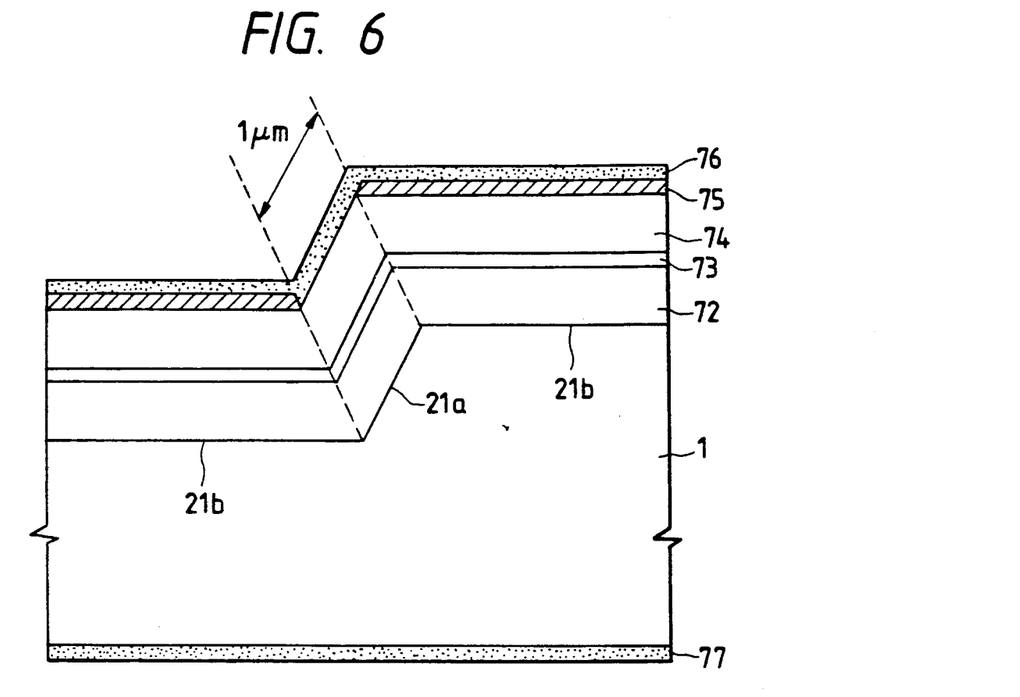
FIG. 6 is a partial sectional view of one embodiment of a semiconductor laser pertaining to the present invention.

This example was carried out to prepare a semiconductor laser device pertaining to the present invention, the sectional view of which is shown in FIG. 6. On a Si-doped n-type GaAs substrate (1) were formed consecutively a cladding layer (1770 periods, 1 μm) of n-type $(AlP)_1(InP)_1$ atomic-layer superlattice (72), an active layer (177 periods, 0.1 μm) of $(GaP)_1(InP)_1$ atomic-layer superlattice (73), and a cladding layer (1770 periods, 1 μm) of p-type $(AlP)_1(GaP)_1$ atomic-layer superlattice (74). The GaAs substrate (1) has a 1 μm wide facet which has previously been made, as shown in FIG. 6. The same procedure as in Example 1 was employed to form the cladding layer (72, active layer (73), and cladding layer (74) by OMVPE process from a Group III material and a Group V material supplied alternately. The n-type and p-type dopants were hydrogen selenide and dimethyl zinc, respectively. They were mixed with a Group III material and a Group V material, respectively, and the mixtures were supplied to the growth interface so as to impart n-type conductivity and p-type conductivity, respectively, to the layer of the $(AlP)_1(InP)_1$ atomic-layer superlattice.

The thus formed double-hetero wafer was provided with a current blocking layer (75), a p-type electrode (76), and an n-type electrode (77). Thus there was obtained the desired semiconductor laser device, which has the highest refractive index in part 21a on the (111) plane. Therefore, the process mentioned above permits the production of a refractive index waveguide laser by the single process of crystal growth.

In this example, both the cladding layers and the active layer consist of the atomic-layer superlattice. It is possible to change the active layer or one cladding layer from atomic-layer superlattice to conventional layer. That is, applying atomic-layer superlattice to at least one of cladding layers permits the production of a refractive index waveguide laser.

EXAMPLE 4

Figure 7:
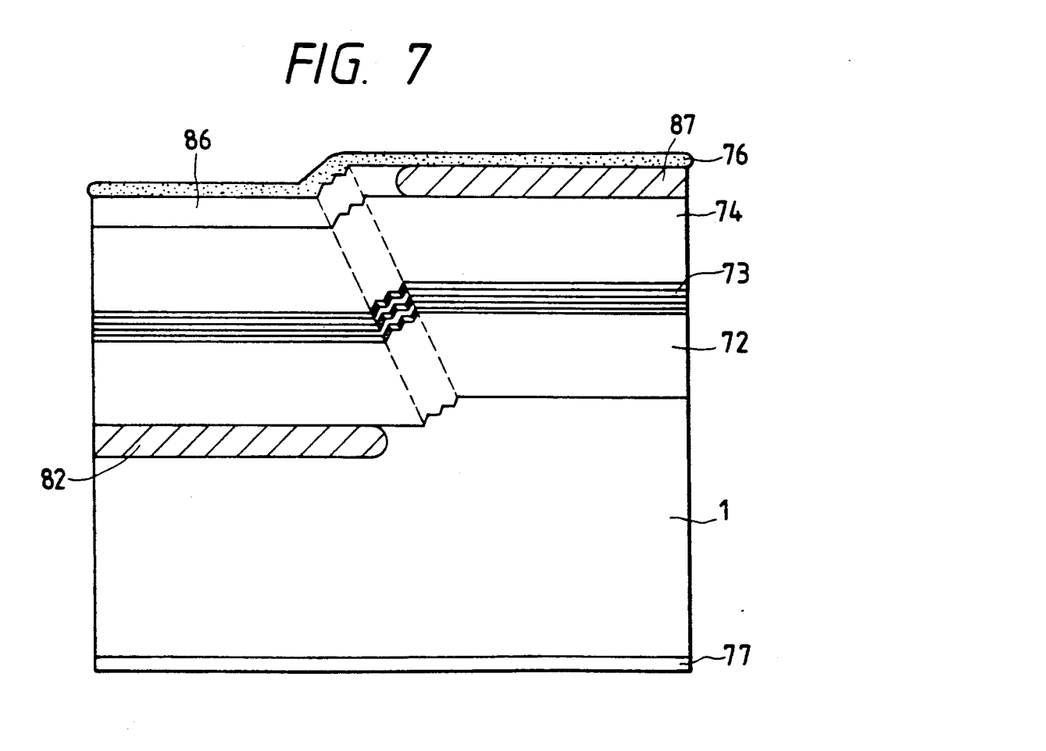
FIG. 7 is a partial sectional view of another embodiment of a semiconductor laser pertaining to the present invention.

This example was carried out to prepare another semiconductor laser device pertaining to the present invention, the sectional view of which is shown in FIG. 7. The first step was to get ready an Si-doped n-type GaAs substrate (1) having three (111) facets, 12.2 nm wide, arranged at an interval of 10 nm. In the left part of the (111) facet of the substrate was formed a high-resistance part (82) by oxygen ion implantation. On the GaAs substrate (1) was formed a cladding layer (1770 periods, 1 μm) of n-type $(AlP)_1(InP)_1$ atomic-layer superlattice (72). On the cladding layer was formed an active layer (73) consisting of $(GaP)_1(InP)_1$ layer (18 periods), $(AlP)_1(InP)_1$ layer (18 periods), $(GaP)_1(InP)_1$ layer (18 periods), $(AlP)_1(InP)_1$ layer (18 periods), and $(GaP)_1(InP)_1$ layer (18 periods), laminated consecutively on top of the other in the same manner as in Example 1. On the active layer (73) was formed a cladding layer (1770 periods, 1 μm) of p-type $(AlP)_1(InP)_1$ atomic-layer superlattice (74). Finally, a p-type GaAs cap layer (86) was formed by epitaxy.

In the right part of the (111) facet of the double-hetero wafer was formed a high-resistance part (87) by oxygen ion implantation. The double-hetero wafer was provided with a p-type electrode (76) and an n-type electrode 77). Thus there was obtained the semiconductor laser device of the present invention. This semiconductor laser device causes the current to concentrate into the (111) facet owing to the high-resistance parts (82) and (87), with the result that the injected carriers join together again in the nine quantum wires. Thus, this example realized a quantum wire semiconductor laser device.

The semiconductor laser of quantum well structure obtained in this example has the following advantages over the ordinary quantum layer semiconductor laser, because the quantum effect depends on the dimensions of structure. (In other words, the quantum effect becomes more remarkable in the order of the one-dimensional quantum well structure (quantum layer), the two-dimensional quantum well structure (quantum wire), and the three-dimensional quantum well structure (quantum box).

(1) It has a lower threshold current.
(2) It has a threshold current which depends less on temperature.
(3) It has a high resonance frequency.
(4) It has a narrower lasing spectrum line width.

In addition, the semiconductor structure which is prepared according to the present invention will find use as an optical harmonic generation device and an optical memory, because it has an increased nonlinear optical efficiency.

As mentioned above, the present invention provides a semiconductor structure in which several kinds of quantum wires or quantum boxes having different physical properties, or an atomic-layer superlattice having the enlarged structure of the quantum wire or quantum box, are arranged in the in-plane direction of a substrate. In addition, the present invention provides a semiconductor laser device having this structure.

What is claimed is:

1. A semiconductor structure which has a substrate crystal having a plurality of crystal orientations and above said crystal is an atomic-layer superlattice in which different semiconductors are laminated one over another with a period in terms of atomic layers and which is made up of semiconductor layers each having a thickness of 1-atom to 5-atom layer, with at least a part of said atomic-layer superlattice having a different band gap than the remainder.

2. A semiconductor structure as claimed in claim 1, in which the crystal orientation includes at least one plane selected from the group consisting of the (100) plane and the (111) plane.

3. In a semiconductor laser device which has, above a substrate, two cladding layers and one active layer interposed between said cladding layers, said substrate being a substrate crystal having two (100) planes and at least one (111) plane arranged between said two (100) planes, at least one layer selected from the group of said two cladding layers and one active layer being an atomic-layer superlattice in which different semiconductors are laminated one over another with a period in terms of atomic layers and which is made up of a semiconductor layers each having a thickness of 1-atom layer to 5-atom layer and a portion thereof corresponding to said active region has a refractive index larger than that of the remainder of said active region, and a light emitting active region in said active layer being above said (111) plane.

4. The device of claim 3, in which at least one layer of said cladding layers is said atomic-layer superlattice and the portion thereof corresponding to said active region has a refractive index larger than that of the remainder.

5. The device of claim 4, in which said active region consists of one (111) plane, said cladding layers and active layer are said atomic-layer superlattice and the portions thereof corresponding to said active region each has a refractive index larger than that of the remainder.

6. The device of claim 3, in which said substrate crystal corresponding to said active region has a plurality of (111) planes and a plurality of (100) planes arranged between said (111) planes, said active layer is said atomic-layer superlattice and said active region consists of quantum wire structure.

7. The device of claim 6, in which said cladding layers are also said atomic-layer superlattice.

* * * * *

UNITED STATES PATENT AND TRADEMARK OFFICE
CERTIFICATE OF CORRECTION

PATENT NO. : 5,073,893
DATED : December 17, 1991
INVENTOR(S) : Masahiko Kondou

It is certified that error appears in the above-identified patent and that said Letters Patent is hereby corrected as shown below:

| Column | Line | |
|---|---|---|
| 3 | 52 | Before "consequence" change "a 3 is" to --3 is a--. |
| 6 | 56 | After "planes," insert --a light emitting active region in said active layer being above said (111) plane,--. |
| 6 | 64-66 | After "remainder" delete "of said active region, and a light emitting active region in said active layer being above said (111) plane". |

Signed and Sealed this

Twenty-ninth Day of June, 1993

Attest:

MICHAEL K. KIRK

Attesting Officer

Acting Commissioner of Patents and Trademarks